(12) United States Patent
Chua (10) Patent No.: US 6,734,466 B2
(45) Date of Patent: May 11, 2004

(54) COATED PHOSPHOR FILLER AND A METHOD OF FORMING THE COATED PHOSPHOR FILLER

(75) Inventor: Bee Yin Chua, Air Itam (ML)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/282,859

(22) Filed: Oct. 29, 2002

(65) Prior Publication Data

US 2003/0168669 A1 Sep. 11, 2003

(30) Foreign Application Priority Data

Mar. 5, 2002 (ML) ................................ PI 20020780

(51) Int. Cl.[7] .............................................. H01L 29/16
(52) U.S. Cl. ............................. 257/82; 257/82; 257/84
(58) Field of Search ............................ 257/98, 82, 84, 257/79, 81, 89, 91; 252/301

(56) References Cited

U.S. PATENT DOCUMENTS

| 3,961,106 A | 6/1976 | Heytmeijer et al. |
| 6,501,102 B2 * | 12/2002 | Mueller-Mach et al. ...... 257/84 |
| 2001/0002049 A1 | 5/2001 | Reah et al. |

FOREIGN PATENT DOCUMENTS

| EP | 0754745 A1 | 7/1996 |
| EP | 0852255 A2 | 12/1997 |
| EP | 1199757 A1 | 10/2001 |

* cited by examiner

*Primary Examiner*—Huan Hoang
*Assistant Examiner*—Thinh T Nguyen (57) ABSTRACT

An improved coated phosphor filler for an optical device includes a plurality of individual phosphor filler particles, and a coating layer having a plastic substance coated on each of the phosphor filler particles.

9 Claims, 4 Drawing Sheets

PRIOR ART

FIG 2a

PRIOR ART

FIG 2b

PRIOR ART

FIG 3a

PRIOR ART

COATED PHOSPHOR FILLER AND A METHOD OF FORMING THE COATED PHOSPHOR FILLER

The invention relates to a coated phosphor filler for an optical device (e.g., a light emitting diode (LED)), a method for forming a coated phosphor filler and a method for forming a LED making use of that coated phosphor filler.

BACKGROUND OF THE INVENTION

In the prior art, phosphor fillers including phosphor particles are used in a broad field of applications, ranging from electro-luminescence to photo-luminescence devices. This rich applicability is due to the favourable physical properties of phosphor such as a high luminescence efficiency and lifetime as well as due to the presence of suitable emission colours in the optical emission spectrum.

A technological application of such phosphor fillers with increasing importance is the light emitting diode (LED), which comprises a LED-chip being electrically connected to a electrically conducting contact base. The LED-chip usually comprises a semiconducting p-n-junction, in which electrons and holes, which have been injected via a supply voltage, recombine under light emission. In order to direct the light emission into the operational direction of the LED-Chip, the LED-Chip is usually encapsulated by an optical dome made of transparent resin which, in turn, may include a phosphor filler by which the light emitting spectrum of the LED-Chip can be converted as necessary.

In particular, due to the development of blue emitting LED-chips and the use of such phosphor fillers, LED-devices providing a wide colour range can be obtained, including the so-called "white LED", which can compete with conventional types of light sources in a broad field of applications such as traffic lights and signboards.

Generally speaking, such phosphor fillers may be based on different types of phosphor compounds, namely stable and unstable phosphor compounds. Stable phosphor compounds may e.g. comprise members of the garnet family, preferably $(YGd)_3Al_5O_{12}$ including $Ce^{3+}$-impurities. Unstable phosphor compounds may e.g. comprise $SrGa_2S_4:Eu^{2+}$, $SrS:Eu^{2+}$, $(Sr,Ca)S:Eu^{2+}$, $ZnS:Ag$.

The advantage of a phosphor filler in the form of stable phosphor compound particles is that it is not sensitive to moisture which would, in turn, reduce the reliability of the electrical device, like an LED-Chip encapsulated in an epoxy dome comprising such a phosphor filler.

However, it is also known in the prior art that the performance of devices with unstable phosphor compound can be improved, too, by coating the phosphor compound material, i.e. the outer surface of the individual unstable phosphor compound particles, with a protective coating film. In particular, said unstable phosphor compound particles may be coated with an inorganic coating film including a moisture-proof barrier material such as aluminium oxide $(Al_2O_3)$, zinc sulphide $(ZnS)$, silicon nitride $(Si_4N_3)$ or the like. In case of such fillers based on unstable phosphor compounds, the inorganic coating film on the individual phosphor compound particles provides for a chemical and photochemical degradation protection of the phosphor compound.

In the light of the foregoing explanations, the term "phosphor filler" refers, in the following description, to a plurality of phosphor filler particles which are either stable phosphor compound particles or unstable phosphor compounds particles coated with an inorganic moisture-proof coating film.

From U.S. Pat. No. 4,585,673, a method for forming a protective coating film on unstable phosphor compound particles is known, wherein the protective coating film is formed by a gas-phase chemical vapour deposition (MOCVD="metal organic chemical vapour deposition") on the phosphor compound particles which are suspended in a fluidised bed which is maintained in a temperature gradient, said protective coating being a refractory oxide such as aluminium oxide.

U.S. Pat. No. 6,001,477 discloses a method for providing on the surface of individual unstable phosphor compound particles a continuous, non-particulate coating of a metal or metalloid compound such as silicon or boron by means of a reaction between the metal or metalloid and a polymer capable of chelating ions of the metal or metalloid. The resulting coating (e.g. a BA-PVM/MA coating) is chemically adhered to the phosphor compound particles which exhibits improved lumen maintenance when applied to the inner surface of a lamp envelope.

U.S. Pat. No. 5,985,175 discloses a method for providing on individual unstable phosphor compound particles a continuous, non-particulate coating of boron oxide to enhance the quantum efficiency of the phosphor compound particles under ultraviolet (UV) and vacuum ultraviolet (VUV) excitation. The method involves reacting a boron-containing precursor with an oxidizing gas in a fluidised bed of phosphor particles.

Furthermore and more generally, EP 0 539 211 B1 discloses a method for production of a microcapsule type conductive filler, wherein this conductive filler is dispersed in an epoxy type one-component adhesive agent.

Figure 2A:
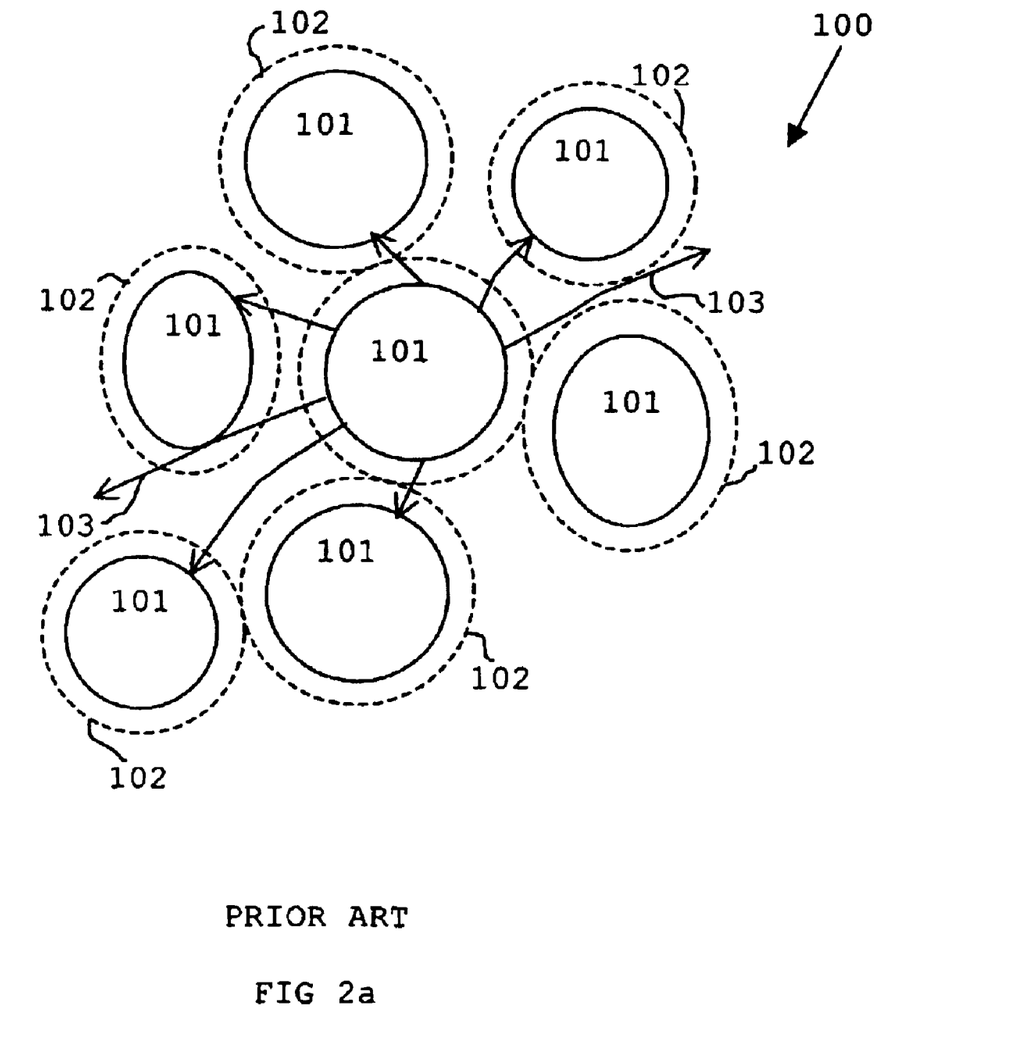
FIGS. 2a–2b are a schematic illustration of a phosphor filler according to the prior art (FIG. 2a) and a schematic illustration of a light emission diode (LED) according to the prior art (FIG. 2b)

A possible structure of a phosphor filler 100 according to the prior art is schematically illustrated in FIG. 2a. The phosphor filler 100 comprises a plurality of unstable phosphor compound particles 101, each of the phosphor compound particles 101 being coated with an inorganic coating film 102. The inorganic coating film 102 consists of a suitable moisture-proof barrier material such as e.g. aluminium oxide $(Al_2O_3)$ and has a thickness in the range of about 3 to 4 µm.

If the thickness of the coating film 102 is large, the coating film 102 provides a significant deterioration of the optical transmissibility. On the other hand, if the thickness of the coating film 102 is low, the spacing between neighbouring phosphor compound particles 101 is relatively small. Consequently, the probability of light symbolized by light beams 103, which is e.g. emitted by a LED as described below with reference to FIG. 2b, to be re-absorbed by surrounding phosphor compound particles 101 is high and, therefore, the brightness obtained in a LED using this kind of phosphor filler is low.

Figure 2B:
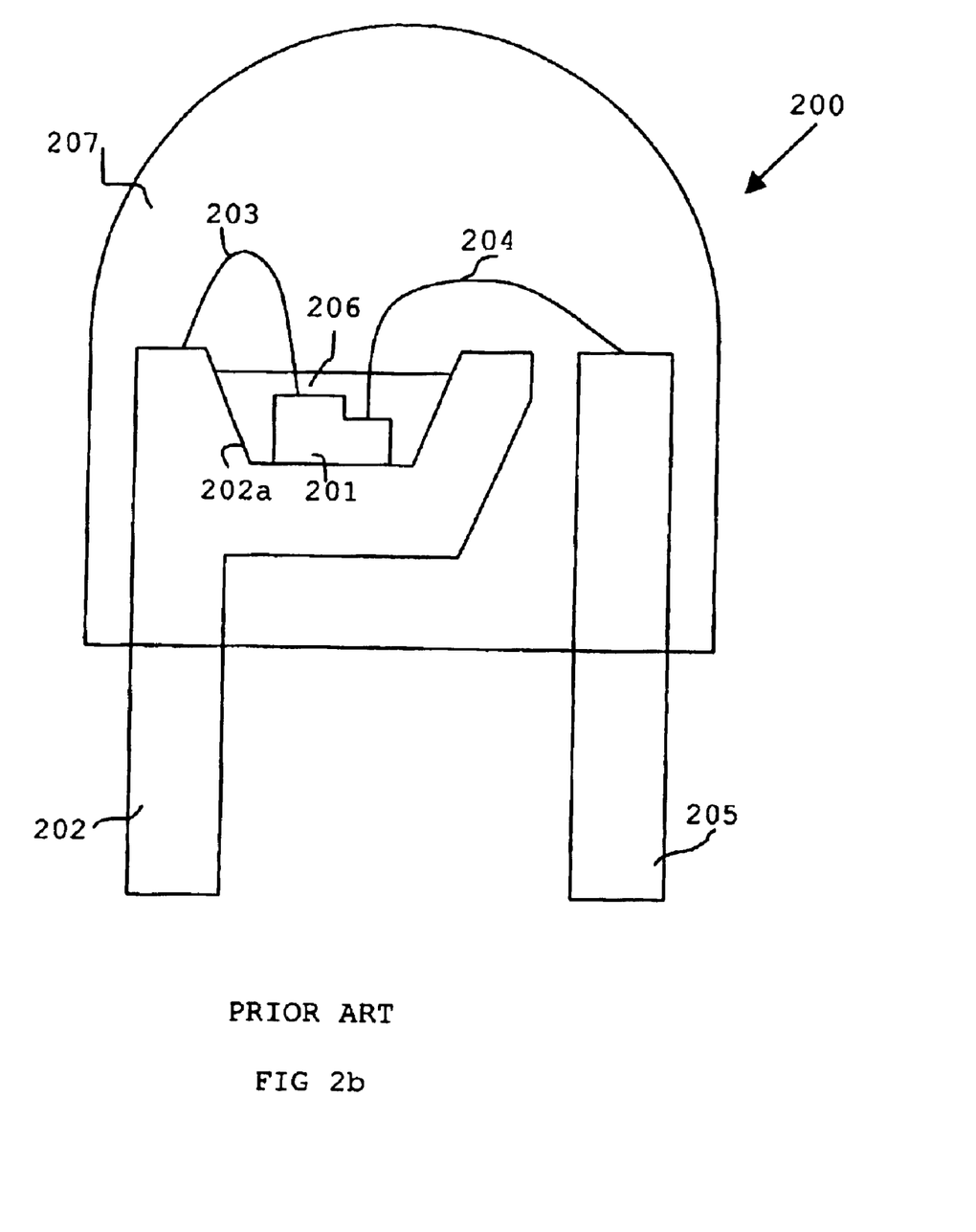

A typical LED 200, as schematically illustrated in FIG. 2b, comprises a LED-chip 201, which is mounted on a first electrically conducting frame 202. Said first electrically conducting frame 202 is provided with a reflector cup 202a including a recess in which the LED-chip 201 is mounted. At least two electrodes (not shown), which may be surface mounted electrodes, are attached on said LED-chip 201, one being electrically connected by means of a first wiring 203 to the first electrically conducting frame 202, and the other being electrically connected by means of a second wiring 204 to a second electrically conducting frame 205.

The LED-chip 201 is covered by a drop 206 containing a mixture consisting of epoxy and a phosphor filler dispersed therein, said drop 206 filling almost the whole recess of the reflector cup 202a. The phosphor compound particles of the phosphor filler may be coated with a coating film including a moisture-proof barrier material such as aluminium oxide ($Al_2O_3$), i.e. they may form a structure as described above with respect to FIG. 2a.

Furthermore, the major upper part of the first and second electrically conducting frames 202 and 205 as well as the whole arrangement formed by the LED-chip 201 covered by the drop 206 and the wirings 203 and 204 are encapsulated by an optical dome (or optical lens) 207 formed of transparent epoxy.

The LED 200 can e.g. be operated as a white light emitting diode, wherein phosphor compound particles in the drop 206 re-emit a broad band of yellow, yellow-green or red-green light with unabsorbed blue light from the LED-chip 201.

Figure 3A:
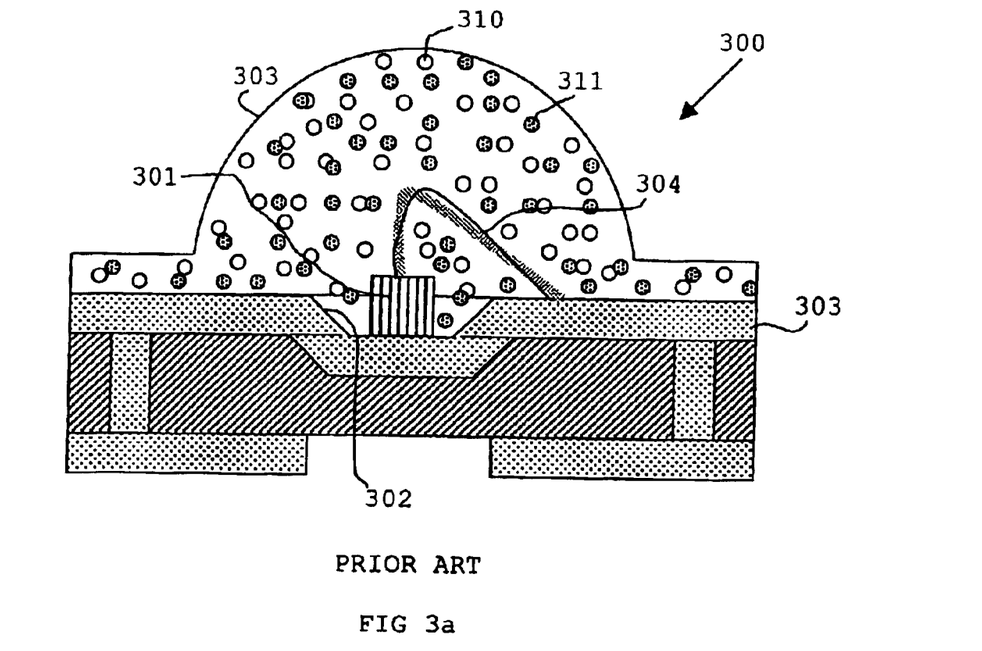
FIGS. 3a and 3b show alternative embodiments of a method for forming a light emission diode (LED).
Figure 3B:
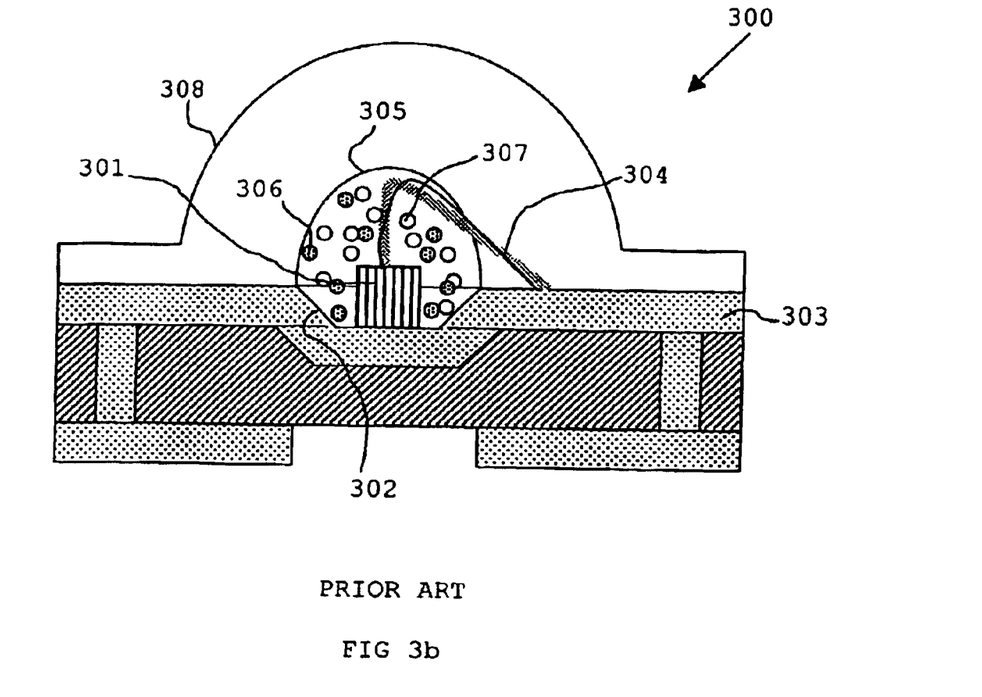

Two common methods for forming a LED device are schematically illustrated in FIG. 3. These methods are generally referred to as the "pre-mix method" (FIG. 3a) and the "pre-dep method" (FIG. 3b).

In the so-called "pre-dep method", as can be seen in FIG. 3b, a LED-chip 301 of a LED device 300 is placed inside a reflector cup 302 of a metal base 303 in a first step. Then the LED-chip 301 is electrically connected, by means of wirings 304, to the metal base 303. In the next step, a drop 305 containing a mixture of phosphor compound particles 306 and epoxy 307 is filled into the reflector cup 302 to cover the LED-chip 301. Finally, the whole structure of the drop 305 covering the LED-chip 301, the wirings 304 and the metal base 303 is over-moulded with epoxy to form a transparent optical dome 308.

In contrast to this method, the so-called "pre-mix method" prevents a procedure of covering of the LED-chip 301 in two steps. To achieve this simplification of the manufacturing process, the LED-chip 301 is over-moulded, as can be seen in FIG. 3a, in only one step by an optical dome 309 containing a pre-mixed mixture of phosphor compound particles 310 and epoxy 311.

Accordingly, whereas the pre-mix method of FIG. 3a simplifies the manufacturing process, the pre-dip method of FIG. 3b provides, due to the completely transparent optical dome 308, a more efficient light extraction from the LED-chip 301.

However, optical devices such as a light emitting diode (LED) including phosphor fillers according to the prior art, i.e. stable or unstable phosphor compound particles being coated with none or only one protective coating film, respectively, wherein the coating film consists of e.g. aluminium oxide, exhibit several shortcomings for the following reasons:

(1) A significant basic problem of prior art LED devices of the type described above is that the phosphor filler, i.e. the individual phosphor compound particles tend to agglomerate. This problem is observed and equally valid for all type of phosphor fillers discussed above, that is for stable phosphor compound particles as well as for unstable phosphor compound particles which are coated with an inorganic moisture-proof coating film. Such an agglomeration leads, however, to a number of drawbacks in the operating characteristics of the LED device, such as uneven spectral and brightness distribution of the emitted light over the emitting surface of the device, loss of brightness of the LED device based on re-absorption effects between neighbouring agglomerated phosphor particles, etc.

(2) The prior art LED devices containing unstable phosphor compound particles coated with an inorganic film as phosphor filler exhibits a relatively poor light extraction efficiency. In other words the amount of light emitted by such a device compared to the amount of light which would be emitted by a device which does not comprise such a phosphor filler is significantly reduced. This is based on the fact that the refractive index of the inorganic coating film, such as aluminium oxide, differs from the refractive index of the epoxy resin, resulting in that the light entering and passing through the encapsulating dome experiences several times total reflection at the inorganic coating film—epoxy—interfaces and, thereby, captured within the dome.

(3) In the prior art LED device 200, the unstable phosphor compound particles in drop 206 exhibit a relatively large sensitivity to moisture, which may enter in the drop 206 and attack the unstable phosphor compound particles situated therein. Consequently, the LED 200 is subjected to aging effects, so that the reliability of such a prior art LED is relatively low. This effect is especially disadvantageous in applications such as traffic lights or signboards, which generally require lifetimes of the used optical device of more than $10^5$ h.

(4) If unstable phosphor compound particles are used in the drop 206 of the LED 200 which are individually coated with a protective coating film consisting of e.g. aluminium oxide, the protective coating reduces the optical transmission of the drop 206 and thereby the brightness of the LED 200. Accordingly, the thickness of this protective coating and, consequently, the protection of the unstable phosphor compound particles are limited.

Accordingly, the performance of LED's using prior art phosphor filler is insufficient particularly with respect to the agglomeration problem, but, at least in case of unstable phosphor compound particles also with respect to light extraction, i.e. the brightness of the LED. Accordingly, the reliability of the known LED devices is low.

SUMMARY OF THE INVENTION

One feature of the present invention is to provide a phosphor filler and a method for forming a phosphor filler which enable the production of optical devices, such as light emitting diodes (LEDs) including laser diodes, with an improved luminous performance and reliability.

Another feature of the present invention is to provide a light emitting diode (LED) (or a laser diode) and a method for forming a light emitting diode (or a laser diode) with improved luminous performance and reliability.

A further feature of the invention is to provide a phosphor filler which, whether it is based on stable or unstable phosphor compounds, can be evenly dispersed in the transparent plastic substance, like epoxy resin of the optical dome of optical devices.

A further feature of the invention is to provide a phosphor filler which can be evenly dispersed and which, at the same time, eliminates or at least reduces the disadvantageous effects of a thick inorganic coating film on unstable phosphor compound particles.

According to one aspect of the invention, there is provided a coated phosphor filler that includes a plurality of individual phosphor filler particles that are coated with a coating layer having a plastic substance, preferably an optically transparent epoxy composition.

DESCRIPTION OF THE PREFERRED EMBODIMENTS

As will be described in more detail, a coated phosphor filler includes a plurality of individual phosphor filler particles that are coated with a coating layer having a plastic substance, preferably an optically transparent epoxy composition.

Due to this structure of the coated phosphor filler, the performance of an optical device, such as a LED, using such a coated phosphor filler is significantly improved with respect to light extraction, i.e. brightness of the LED device, and reliability of the LED device. Another advantage is that an enhanced reliability of the obtained LED is achieved due to a better passivation of the individual phosphor filler particles against elevated temperatures and humidity.

Since with regard to the optical transmissibility of the phosphor filler, the thickness of the coating layer made in accordance with one embodiment of the present invention is not critical, the distance between neighbouring phosphor filler particles may be significantly enhanced without a deterioration of the optical transmissibility or light extraction. Consequently, the coating film according to the present invention may prevent an agglomeration between neighbouring phosphor particles which is a fundamental advantage of the coated phosphor filler according to the invention. Further, re-absorption effects between different phosphor filler particles are prevented and the luminous performance of the LED device is improved by the use of the inventive coated phosphor filler.

Furthermore, a significant improvement of the light extraction can be achieved with an optical device using the coated phosphor filler made according to the invention. On the one hand, this effect is achieved due to a modification of the refractive indices present between the individual phosphor filler particles and the outer epoxy encapsulation. The inventive structure of the coated phosphor filler is particularly advantageous because the coating layer includes the plastic substance, in particular if including an optically transparent epoxy composition, provides additional "interfaces" between the individual phosphor filler particles and the outer epoxy encapsulation. This "interfaces", preferably epoxy-epoxy-interfaces, have the effect to enhance the extraction efficiency of the optical device due to a modification of the refractive index, since such a modification of the refractive index results in a reduction of Fresnel reflection losses which might otherwise be significant, since the refractive index of e.g. the used LED-chip is relatively high compared to the refractive index of the surrounding epoxy composition. Accordingly, with the presence of additional epoxy-epoxy-interfaces between the LED-chip and the surrounding epoxy encapsulation, these Fresnel reflection losses will be reduced and the light extraction will be enhanced.

On the other hand, a significant improvement of the light extraction in an optical device using the inventive coated phosphor filler is also due to the fact that the need of thick protective layers consisting of e.g. an inorganic passivation material is eliminated. Such protective layers being coated on the individual phosphor particles result in a significant deterioration of light extraction, since they absorb a significant part of the light being emitted by e.g. the LED chip. In the present invention, such a protective passivation layer is either totally dispensable (in case that the phosphor filler particles are stable phosphor compound particles), or the thickness of such a passivation layer may be significantly reduced (in case the phosphor filler particles are unstable phosphor compound particles and an additional, but relatively thin barrier film is provided between the coating layer and the individual phosphor filler particles).

According to a preferred embodiment, the inventive coated phosphor filler structure is applied to phosphor filler particles which are formed by unstable phosphor compound particles coated with a moisture proof barrier film. In this case the coating layer comprising the optically transparent epoxy composition is coated on the barrier film. The phosphor compound particles may e.g. comprise at least one of the components $SrGa_2S_4:Eu^{2+}$, $SrS:Eu^{2+}$, $(Sr,Ca)S:Eu^{2+}$ and $ZnS:Ag$.

In the structure of the coated phosphor filler according to this preferred embodiment, the basic aim of the barrier film is to protect the unstable individual phosphor compound particles from aging effects caused by the surrounding environment such as moisture, thereby preventing any change in the chemical composition of the unstable phosphor compound particles and preserving their quantum efficiency.

However, according to another preferred embodiment, the inventive coated phosphor filler structure can also be applied to phosphor filler particles which are formed by stable phosphor compound particles which do not need to be coated with a moisture proof barrier film. In this case, the phosphor filler particles may comprise at least one member of the garnet family, preferably $(YGd)_3Al_5O_{12}$ including $Ce^{3+}$-impurities.

The basic aim of the coating layer is to prevent an agglomeration of the phosphor filler particles (formed by either one of the above embodiments) and to improve the light extraction to enhance the brightness of the LED device, and also to protect the barrier film against any chemical decomposition effects. Furthermore, the coating layer also provides for additional interfaces between the individual phosphor filler particles and the outer epoxy encapsulation as already explained above, thereby also contributing to an improvement of the light extraction and the brightness of the optical device.

Said barrier film is preferably formed of an inorganic passivation material, which may include a material selected from the group consisting of aluminium oxide, silicon monoxide, zinc sulphide or silicon nitride.

The thickness of the coating layer is preferably in the range of 2 to 6 $\mu$m, more preferably 3 to 5 $\mu$m.

The thickness of the moisture-proof barrier film is preferably in the range of 0.1 to 2 $\mu$m. In particular, the thickness of said coating layer is at least twice the thickness of said barrier film. This is particular advantageous, since due to the optical transparency of the coating layer, the thickness of said coating layer is less critical than the thickness of the barrier film, the latter absorbing a relatively large amount of light emitted by e.g. the LED chip. On the other hand, the large thickness of the coating layer provides for an effective protection of the individual phosphor filler particles against agglomeration.

The thickness of said coating layer may also be 2 to 10 times the thickness of said barrier film.

Said phosphor filler particles preferably have a sphere-like shape, resulting in a relatively easy preparation procedure. Furthermore, such a shape represents an optimum optical and geometrical structure and makes high packing densities in very thin coating layers with relatively low light-scattering possible.

Said epoxy composition is preferably containing hydrophobic residues forming a moisture-repellent barrier, providing for an additional moisture protection of the individual phosphor filler particles.

According to another aspect of the invention, in a method for forming a coated phosphor filler, in particular for use in light emitting diodes, comprising a plurality of individual phosphor filler particles, said phosphor filler particles are coated with a coating layer comprising a plastic substance.

According to a preferred embodiment, unstable phosphor compound particles are used as said phosphor filler particles and said step of coating said phosphor filler particles with a coating layer further comprises the steps of coating said unstable phosphor compound particles with a moisture proof barrier film, and coating the outer surface of said moisture proof barrier film with said coating layer.

According to a preferred embodiment, said step of coating said unstable phosphor compound particles with a moisture proof barrier film is performed by chemically forming said moisture proof barrier film in solution. Said step of coating the outer surface of said moisture proof barrier film with said coating layer may be performed by physically depositing said coating layer on said moisture proof barrier film.

According to another aspect of the invention, a method for forming a light emitting diode (LED) comprises the steps of mounting a LED-chip on a contact base, electrically connecting said LED-chip to a first and a second electrically conducting frame, covering said LED-chip with a coated phosphor filler, said coated phosphor filler including a plurality of individual phosphor filler particles, wherein said coated phosphor filler is subjected to a pre-treatment, wherein said phosphor filler particles are coated with a coating layer comprising a plastic substance.

According to another preferred embodiment, unstable phosphor compound particles are used as said phosphor filler particles and said step of coating said phosphor filler particles with a coating layer further comprises the steps of coating said unstable phosphor compound particles with a moisture proof barrier film, and coating the outer surface of said moisture proof barrier film with said coating layer.

According to a further preferred embodiment, the step of covering said LED-chip in said first electrically conducting frame with a coated phosphor filler further comprises the steps of dispensing said LED-chip with a drop of said coated phosphor filler in a reflector cup provided in said first electrically conducting frame, and over-moulding said drop and at least a part of said first electrically conducting frame with an optical dome consisting of an optically transparent epoxy.

According to another preferred embodiment, the step of covering said LED-chip in said first electrically conducting frame with a coated phosphor filler further comprises the steps of forming a mixture between a plurality of said individual phosphor filler particles and an optically transparent epoxy, and over-moulding said LED-chip and at least a part of said first electrically conducting frame with said mixture to form an optical dome.

According to a further aspect of the invention, a mixture is provided which is prepared in particular for use in the above method. Said mixture is a mixture of a plurality of said individual phosphor filler particles and an optically transparent epoxy, wherein said phosphor filler particles are coated with a coating layer comprising a plastic substance and is advantageous in so far, as the necessary compound does not have to be individually prepared in each manufacturing process to obtain the above desired effects according to the present invention.

According to another aspect of the invention, a light emitting diode (LED) comprises a LED-chip mounted on a contact base, said LED-chip being electrically connected to a first and a second electrically conducting frame, and a coated phosphor filler, said coated phosphor filler including a plurality of phosphor filler particles and covering said LED-chip, wherein said phosphor filler particles are coated with a coating layer comprising a plastic substance.

According to a preferred embodiment, said LED-chip is covered with a drop of said coated phosphor filler in a reflector cup provided in said first electrically conducting frame, and said drop and at least a part of said first electrically conducting frame are over-moulded with an optical dome consisting of an optically transparent epoxy.

According to another preferred embodiment, said LED-chip and at least a part of said first electrically conducting frame are over-moulded with a mixture between a plurality of said individual phosphor filler particles and an optically transparent epoxy, said mixture forming an optical dome.

According to another preferred embodiment, an optical dome is provided covering said LED-chip and consisting of an epoxy material, providing for a protection of the whole arrangement without disturbing its optical properties.

Figure 1A:
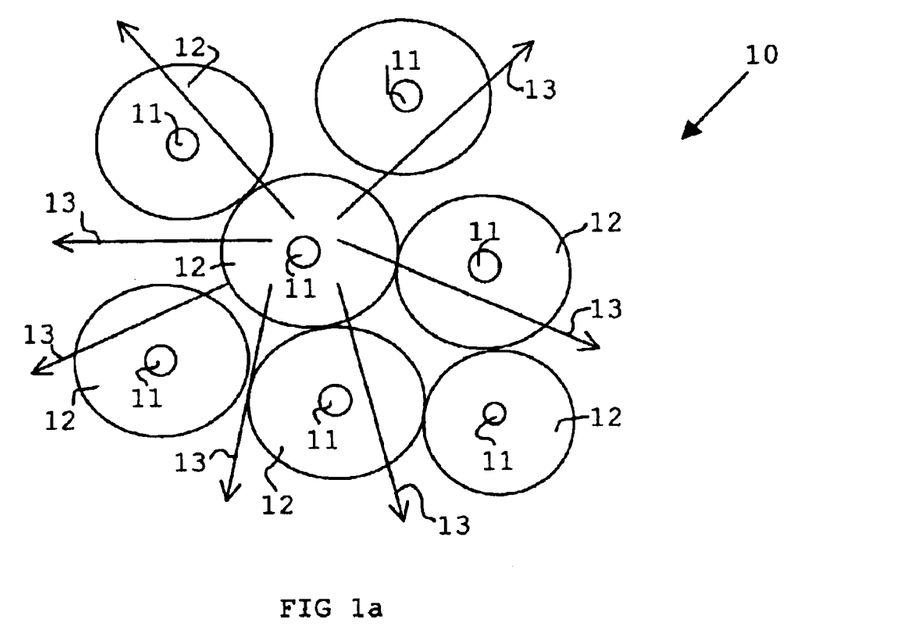
FIGS. 1a and 1b are schematic illustrations showing preferred embodiments of the coated phosphor filler according to the present invention and its effect on the ability of light emission.
Figure 1B:
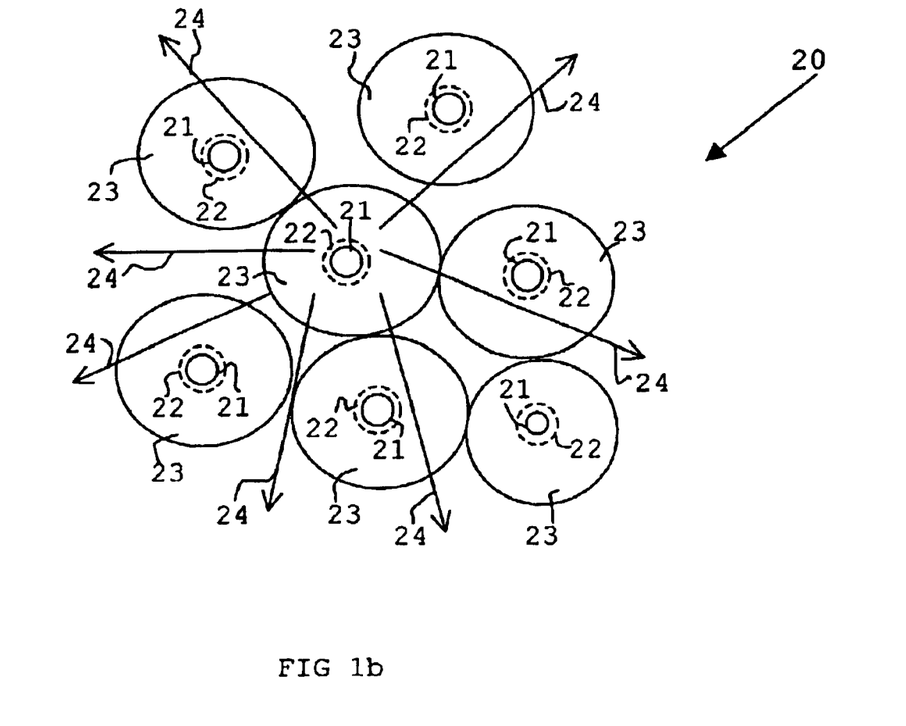

FIG. 1a and FIG. 1b demonstrate in a schematic view the effect of the inventive structure of the coated phosphor composition on the ability of light emission.

FIG. 1a shows a preferred embodiment of a coated phosphor filler 10 according to the present invention. The coated phosphor filler 10 includes a plurality of stable phosphor compound particles 11, which may include at least one member of the garnet family, preferably $(YGd)_3Al_5O_{12}$ including $Ce^{3+}$-impurities.

The individual phosphor compound particles 11 have a sphere-like shape, and each phosphor compound particle has a diameter in the range of 10±5 $\mu$m. Each of the phosphor compound particles 11 is coated with a coating layer 12 comprising a plastic substance, preferably an optical transparent epoxy. According to this preferred embodiment of the invention, the coating film is 3 to 4 $\mu$m thick.

Preferably, the coating layer 12 is coated on the individual phosphor particles by physically depositing the coating film on the individual phosphor compound particles. This may e.g. be performed by an immersion of the phosphor compound particles in the epoxy, followed by a drying period.

The epoxy composition forming the coating layer 12 preferably contains hydrophobic residues, which constitute an additional moisture-repellent barrier and, thereby, provide for an additional protection of the stable phosphor compound particles 11.

Experiments have shown that phosphor fillers coated with a coating film according to the invention do not tend to agglomerate when the phosphor filler particles are dispersed in the epoxy used e.g. to form a transparent optical dome above a LED-chip.

Furthermore, since the coating layer 12 is formed of a transparent epoxy material, it does not deteriorate the light extraction of the optical device, e.g. the LED-chip. As can be seen in FIG. 1a, light beams symbolized by arrows 13 are extracted from a particular phosphor particle without being disturbed by the surrounding phosphor particles 11 or by the coating film 12. Consequently, the brightness of an optical device, such as a LED, using the phosphor filler according to the invention 10 is enhanced.

FIG. 1b shows another preferred embodiment of a coated phosphor filler 20 according to the invention. In this embodiment, the coated phosphor filler includes a plurality of unstable phosphor compound particles 21, which may e.g. comprise at least one of the components $SrGa_2S_4:Eu^{2+}$, $SrS:Eu^{2+}$, $(Sr,Ca)S:Eu^{2+}$ and $ZnS:Ag$.

Each individual phosphor compound particle is coated with a film 22 consisting of a suitable moisture-proof barrier material, preferably an inorganic passivation material such as e.g. aluminium oxide ($Al_2O_3$). Said barrier material may also contain other types of passivation materials such as silicon monoxide (SiO), zinc sulphide or silicon nitride ($Si_3N_4$).

The coating of the unstable phosphor compound particles with the moisture proof barrier film 22 is preferably performed by the so-called Wet Chemical process. Again, the coating layer 23 may be coated on the moisture proof barrier film 22 by physically depositing the coating film on the moisture proof barrier film 22, which may e.g. be performed by an immersion of the phosphor compound particles coated with the film 22 in epoxy and following by a drying period.

According to the invention, on each moisture-proof barrier film 22 a coating layer 23 is coated, which corresponds to the coating layer 12 in the coated phosphor filler 10 of FIG. 1a, and which comprises a plastic substance, preferably an optical transparent epoxy. In a preferred embodiment, oxygen-containing functional groups of the epoxy compounds chemically interact, i.e. form a chemical bond, with the metal ions (e.g. aluminium ions) of the barrier material (e.g. aluminium oxide, $Al_2O_3$). Moreover, the coating layer 23 is again preferably formed by hydrophobic epoxy compounds which constitute an additional moisture-repellent barrier providing for an additional protection of the unstable phosphor compound particles 21. Consequently, according to this preferred embodiment of the invention, the thickness of the barrier film 22 can be reduced compared to the thickness of the barrier film 102 of the prior art phosphor filler 100 as shown in FIG. 2a without deteriorating the moisture protection of the unstable phosphor compound particles 21. Further, an optical device such as a LED having an optical dome with phosphor filler particles dispersed therein, wherein the phosphor filler particles comprise a thin barrier film according to this preferred embodiment of the invention, provides for superior light emitting characteristics due to the thinner moisture-proof barrier film.

Preferably, the thickness of said coating layer 23 is relatively large compared to the thickness of said barrier film 22. More specifically, the thickness of the coating layer 23 can be at least twice, or preferably 2 to 10 times the thickness of the barrier film 22.

In particular, the thickness of the moisture-proof barrier film 22 can be in the range of about 0.1 to 2 $\mu$m, whereas the coating layer 23 may have a thickness of about 2 to 6 $\mu$m and, further preferably, of 3 to 5 $\mu$m.

Similar to the embodiment shown in FIG. 1a, the phosphor filler comprising unstable phosphor compound particles 21 coated with the moisture-proof barrier film 22, which, in turn, are coated with the coating layer according to this embodiment of the invention shown in FIG. 1b, does not tend to agglomerate when the phosphor filler particles are dispersed in the epoxy used e.g. to form a transparent optical dome above a LED-chip.

As can be seen from FIG. 1a and FIG. 1b, the distance between neighbouring phosphor filler particles 11 or 21 and 22 in the coated phosphor filler 10 and 20, respectively, is significantly enhanced compared to the prior art phosphor filler illustrated in FIG. 2a. Consequently, the ratio of light (symbolized in FIG. 1a and FIG. 1b by light beams 13 or 24, respectively) emitted through the gap which is left between surrounding phosphor filler particles 11 or 21 and 22 is enhanced, leading to an improvement of the brightness achieved in a LED using this kind of coated phosphor fillers.

Since the coated phosphor filler 10 of FIG. 1a comprises stable phosphor compound particles 11 and, therefore, does not need a moisture-proof barrier film around the particles 11, the phosphor filler 10 exhibits a higher optical transmissibility compared to the phosphor filler 20 of FIG. 1b which comprises unstable phosphor compound particles 21 coated with the moisture-proof barrier film 22. However, in the phosphor filler 20 of FIG. 1b, the thickness of the additional barrier film 22 including the moisture-proof barrier material may be significantly lower than in the prior art, while still giving an additional protection to the unstable phosphor compound particles 21 against humidity and corresponding aging effects by means of the coating layer 23.

The coated phosphor filler according to the present invention may be used to form optical devices, such as a white LED as illustrated in FIG. 2b, by means of conventional methods, such as the "pre-mix" method or the "pre-dep" method described above with respect to FIG. 3a, b. Due to the inventive structure of the coated phosphor filler, the performance of such an optical device is significantly improved with respect to light extraction and brightness of the optical device, but also with respect to the reliability of the optical device.

What is claimed is:

1. A light emitting diode (LED) comprising
    a LED-chip mounted on a contact base, said LED-chip being electrically connected to a first and a second electrically conducting frame; and
    a coated phosphor filler, said coated phosphor filler including a plurality of phosphor filler particles and covering said LED-chip, wherein said phosphor filler particles are coated with a coating layer comprising a plastic substance.

2. The light emitting diode (LED) according to claim 1, wherein said LED-chip is covered with a drop of said coated phosphor filler in a reflector cup provided in said first electrically conducting frame, and wherein said drop and at least a part of said first electrically conducting frame are over-moulded with an optical dome consisting of an optically transparent epoxy.

3. The light emitting diode (LED) according to claim 1, wherein said LED-chip and at least a part of said first electrically conducting frame are over-moulded with a mixture of a plurality of said individual phosphor filler particles and an optically transparent epoxy, said mixture forming an optical dome.

4. The light emitting diode (LED) according to claim 1, wherein the plastic substance is an optically transparent epoxy composition.

5. The light emitting diode (LED) according to claim 1, wherein said phosphor filler particles are unstable phosphor compound particles coated with a moisture-proof barrier film, the coating layer being provided on the outer surface of said barrier film.

6. The light emitting diode (LED) according to claim 1, further comprising an optical dome, said optical dome covering said LED-chip and consisting of an epoxy material.

7. The light emitting diode (LED) according to claim 1, said barrier material includes an inorganic passivation material.

8. The light emitting diode (LED) according to claim 7, said inorganic passivation material including a material selected from the group consisting of aluminium oxide ($Al_2O_3$), silicon monoxide (SiO), zinc sulphide (ZnS) or silicon nitride ($Si_3N_4$).

9. The light emitting diode (LED) according to claim 1, said epoxy composition includes hydrophobic residues forming a moisture-repellent barrier.

* * * * *